United States Patent [19]

Paquet et al.

[11] Patent Number: 5,017,404

[45] Date of Patent: May 21, 1991

[54] PLASMA CVD PROCESS USING A PLURALITY OF OVERLAPPING PLASMA COLUMNS

[75] Inventors: Volker Paquet, Mainz; Ulrich Ackermann, Mainz-Gonsenheim; Heniz-W. Etzkorn, Neu-Ansbach; Ralf T. Kersten, Bremthal; Uwe Rütze, Mainz, all of Fed. Rep. of Germany

[73] Assignee: Schott Glaswerke, Mainz, Fed. Rep. of Germany

[21] Appl. No.: 403,429

[22] Filed: Sep. 6, 1989

[30] Foreign Application Priority Data

Sep. 6, 1988 [DE] Fed. Rep. of Germany ....... 3830249

[51] Int. Cl.$^5$ .............................................. B05D 3/06
[52] U.S. Cl. ..................... 427/45.1; 427/39; 427/38; 427/54.1; 427/166; 118/723; 118/722
[58] Field of Search .................. 427/45.1, 38, 39, 165, 427/166, 54.1; 118/722, 723

[56] References Cited

U.S. PATENT DOCUMENTS

| | | | |
|---|---|---|---|
| 4,525,381 | 6/1985 | Tanaka et al. | 427/54.1 |
| 4,539,068 | 9/1985 | Takagi et al. | 156/614 |
| 4,593,644 | 6/1986 | Hanak | 118/719 |
| 4,633,811 | 1/1987 | Maruyama | 118/723 |

FOREIGN PATENT DOCUMENTS 62-298106 12/1987 Japan .

OTHER PUBLICATIONS

Abstract of the Disclosure, German Patent No. OS 3,326,020, 1.31.1985.
J. Kieser and M. Neusch, "Industrial Microwave Plasma Polymerization," Thin Solid Films, 118 (1984) 203-210.

Primary Examiner—Norman Morgenstern
Assistant Examiner—Roy V. King
Attorney, Agent, or Firm—Millen, White & Zelano

[57] ABSTRACT

A plasma process and apparatus are provided for coating one or more planar substrates by a plasma-induced chemical vapor deposition in which plasma electrodes provide a plurality of overlapping plasma columns which extend over the entire surface of the substrate to be coated. A plurality of plasma electrodes are fixed in planes above, between, or below the substrates, and the individual plasma electrodes can be separately controlled. With a plasma pulse/CVD process, the spacing and angle between the substrates can be varied to alter the thickness of the coating. The process can be used for coating large area, planar vitreous bodies with multilayer optical coatings.

34 Claims, 4 Drawing Sheets

PLASMA CVD PROCESS USING A PLURALITY OF OVERLAPPING PLASMA COLUMNS

BACKGROUND OF THE INVENTION

The present invention relates in general to a plasma-induced chemical vapor phase deposition process and apparatus for coating planar substrates and, more particularly, to a system of using a plurality of plasma electrodes to activate a mixture of reaction gases and deposit from said gases a dielectric coating on one or more substrate surfaces.

THE PRIOR ART

It is known that thin hydrocarbon coatings can be deposited on planar substrates in a reaction chamber by using a plasma to activate a mixture of reaction gases therein, Thin Solid Films, J. Kieser and M. Neusch, Vol. 118 (1984), pages 203–210. The substrates, which are clamped in a frame, are passed into a reaction chamber through an activating plasma zone. The plasma is formed by a microwave source located outside of the reaction chamber, the microwaves passing through a window in the reaction chamber which is transparent to microwaves. In this plasma polymerization process, the size of the window determines the size of the coating plasma zone in the reaction chamber.

It is also known that in a plasma pulse process used for coating larger planar substrates, the plasma electrode is moved linearly back and forth above the surface to be coated, OS 3,326,020.

Dr. Kieser, Maschinenmarkt, 37/86, pages 3–7, describes a microwave plasma polymerization process in which a pallet having thereon a plurality of substrates adjacent one another is moved past a window transparent to microwaves. An arrangement of microwave guide structures above the window are connected to a plurality of microwave supply leads and down leads. A microwave field passes through the window, generating a plasma zone through which the substrates move to be coated.

The above-described processes have the disadvantage that in coating large substrates, it is necessary to move either the substrate or the plasma generator so as to expose all of the surface to be coated to the plasma zone. Another disadvantage is that relatively expensive precision equipment capable of withstanding elevated coating temperatures is needed to accurately move the substrate through the plasma zone. Also, movement of the substrate in the reaction zone during the coating process often leads to an undesired deposition of dust particles on the surface of the substrate. Another disadvantage of the prior art processes is that they do not produce a coating whose properties can be varied at each site on the surface of the substrate being coated.

According to the above-described prior art, it is not possible, for example, to coat large substrates with a layer which is of uniform thickness, structure, and composition over the entire surface area because higher field strengths at the substrate edges produces higher deposition rates at the edges than at the middle of the substrate. Since only a single large substrate, or else, a plurality of smaller substrates can be coated at the same time, these known coating processes are uneconomical for coating a plurality of large planar substrates.

As a result, there is a need for a plasma-induced chemical vapor phase deposition coating process which can be used to simultaneously coat a plurality of substrates, including large planar substrates. It is also desirable to have such a process in which the coating properties for each substrate can be controlled at each site on the surface being coated.

SUMMARY OF THE INVENTION

According to the present invention, it has been found that in a plasma-induced chemical vapor deposition process, a plurality of plasma electrodes can be positioned sufficiently adjacent one another so as to provide overlapping plasma columns without any deleterious effects, i.e., interference between adjacent high frequency fields. According to the invention, the coating process can be controlled by varying the amount and duration of power supplied to each plasma electrode. Accordingly, the rate of coating can be controlled at any site on the surface being coated by controlling the plasma columns independent of one another.

The process of the present invention has the advantage of using known plasma electrodes of simple compact design and low vulnerability to mechanical shock. These plasma electrodes are described in, for example, Meinkel Gundlach, Taschenbuch der Hochfrequenztechnik, 3, Auflage, Springer Verlag. Because of their small size, these plasma electrodes are normally not employed for coating large substrates. The formation of standing waves which result in non-homogeneities in the plasma are often observed when large area plasma electrodes are used. The presence of standing waves often result in irregularities in the coating. It has been discovered that these non-homogeneities do not occur when using the process of the present invention.

The size and geometry of the surfaces of articles to be coated are practically unlimited. The process of the present invention can be used to coat any substrate, since many closely spaced plasma electrodes can be positioned adjacent one another to cover any size or geometry of substrate.

Any dielectric material can be coated by the process of the present invention. Preferably, quartz glass is employed as a substrate.

Any of the dielectric materials which can be deposited by a plasma process can be used in the present invention. For example, vitreous coatings preferably consist of one or more oxides of the group of $SiO_2$, $B_2O_3$, $GeO_2$, $P_2O_5$, $TiO_2$, $ZrO_2$, $HfO_2$, $SnO_2$, $ZnO$, $Al_2O_3$, and $SiO_xN_y$. Preferably, reaction gases from which the coating can be deposited are OH-free chloride compounds and/or, because of their relatively high vapor pressure, the organometallic compounds of the substances to be deposited.

According to the invention, both the plasma electrodes and substrates are in a fixed position in the reaction chamber. Consequently, the previously described disadvantages of the prior art are obviated. The substrates can be heated by either surrounding the reaction chamber with an oven or by using an oven as the reaction chamber.

According to a preferred aspect of the invention, the substrate is heated to a temperature of between about 200–1200° C. before the coating is applied. A substrate temperature which is as high as possible, for example, approximately 1100° C. for quartz glass substrates and high silica content glass substrates, guarantees that glasslike, hydrogen-free coatings (less than 1 ppm of hydrogen) of high optical quality (low absorption and scattering, and uniform structure) are deposited.

In another preferred embodiment, a microwave plasma is employed. Microwaves, i.e., electromagnetic waves in the frequency range of from a few 100 MHz to a few GHz, compared with low-frequency waves, e.g., waves of about 13 MHz, are especially suitable herein. Plasma excitation with microwaves has the advantage that high coating rates can be obtained in the 0.5 to 10 mbar pressure range; microwave plasmas are very stable; a comparatively low power must be expended for a predetermined plasma volume; and there is a high coupling efficiency of the power of the plasma generator into the plasma.

In the process of the present invention, any type of plasma electrode can be used, and the invention is not limited to any particular type of plasma electrode.

It is preferred when using a microwave plasma to employ microwave antenna from the group of large area radiators, dielectric antenna, or combinations thereof. A preferred large area radiator is the horn antenna, and a preferred dielectric antenna is the rod radiator. These types of plasma electrodes, the suitability of which has not heretofore been known in plasma coating of large area substrates, are distinguished by a simple, compact design, uncomplicated operation, and good emission characteristics.

In a preferred embodiment of the invention, the plasma electrodes are separated from the reaction zone by a housing, a portion of which is formed from a dielectric plate. The housing is preferably evacuated to a pressure sufficiently low, e.g., to less than about 100 mbar, to avoid flashovers between the antennae. Flashovers can also be minimized by introducing gaseous $SF_6$ into the housing independently of the overall pressure in the housing. The microwave fields extend through the dielectric housing plate and form a plurality of rows of plasma columns in the reaction zone between the dielectric housing plate and substrate. The substrate is preferably positioned opposite the dielectric housing plate, which can also be employed as a substrate.

In a preferred embodiment of the invention, a plurality of substrates are positioned one above the other so that they can all be coated simultaneously. Since the dielectric plate is transparent to high frequency generated plasmas, it is sufficient to position the plasma electrodes above and/or below the arrangement of the substrates in planes substantially parallel or slightly inclined to the surfaces to be coated. In this embodiment, the plasma columns are substantially perpendicular to the surfaces being coated. The same arrangement of plasma electrodes can be used in applying a coating to a single substrate.

When coating a plurality of substrates according to the process of the present invention, it is preferred to align the substrates with the surfaces to be coated spaced apart and facing one another. The space between the substrates forms a reaction zone or chamber into which the gaseous reaction mixture is introduced.

The rear surfaces of two such opposed substrates can be in contact with the rear surface of another similar substrate, or else, the rear surfaces can be spaced apart to form additional chambers. In the latter case, the additional chambers can contain a non-reactive gas, preferably oxygen, which when activated by a plasma, emits UV radiation. Thus, this radiation, which strikes the rear surface of the substrates, heats the substrates to a desired temperature.

Preferably, the distance between the substrate surfaces to be coated is between about 1–300 mm, more preferably between 5–20 mm.

To improve the control of the coating properties, another preferred embodiment provides for additional plasma electrodes arranged in a plane between the two surfaces to be coated. In this embodiment, the electrodes are arranged so that the plasma columns extend between and parallel to the surfaces of the substrates being coated.

If the entire coated area is to be uniform with respect to coating thickness, composition, and structure, it is necessary to compensate for edge effects which result from non-homogeneities in the plasma field strength. This is accomplished by using plasma power levels and periods of operation at the edge of the substrate different from those used in the interior.

In another preferred embodiment of the invention, a dielectric plate is positioned above and/or below a substrate or a plurality of substrates, which are arranged one above the other. The plasma electrodes are positioned in planes between the areas of the substrates to be coated and a substrate and a dielectric plate, respectively. In this arrangement, a plasma is propagated substantially parallel to the surfaces being coated. In this embodiment, each of the reaction chambers formed between the substrates or between the substrate and dielectric plate can be subjected to a different strength of plasma so that the coatings on the surfaces will have different properties.

A plasma pulse/CVD process is preferably employed. In this embodiment, the reaction space (individual reaction chambers) is filled with a fresh mixture of reaction gas, and the gas inlet and outlets are closed. Power is then supplied to the plasma electrodes, and the coating material is deposited from the mixture of reaction gases onto the surfaces to be coated. After the mixture of reaction gases is completely reacted and consumed, the plasma pulse is discontinued, the gas inlet and outlet are opened, and the consumed mixture of reaction gases are replaced by a fresh mixture of reaction gases.

However, in practice, it is preferred to use a continuous gas flow. In such a process, the time lapse between two plasma pulses preferably is sufficient to sweep the reaction zone of spent gases and to replace them with a fresh mixture of reaction gases.

To minimize the amount of expensive reaction gases needed, as high a proportion as possible of the quantity of fresh reaction gases which flows into the reaction space (chambers) is passed between the surfaces to be coated, and the strength and duration of the plasma pulse are controlled so that substantially the entire mixture of reaction gases is depleted of coating material before the reaction chamber is purged. At that point, the local rate of coating is no longer dependent upon the amount of the electric power coupled into the plasma insofar as a threshold value of the power, for example, dependent upon gas composition and pressure, is overshot, but primarily upon the number of molecules of reaction gases present at a particular site to be coated.

The local coating rate, and hence coating properties, can be influenced by arranging the substrates to be coated inclined with respect to one another or with respect to a dielectric plate. As a result, the quantity of the mixture of reaction gases enclosed in the reaction zone between the substrates or between a substrate and dielectric plate varies along the area to be coated. The angle of inclination, which is preferably less than 30°, is dependent upon the desired coating properties. For example, a substantial improvement in the uniformity of the coating thickness can be attained according to a preferred embodiment of the invention by positioning two spaced and opposed substrates to be coated at an angle of inclination $\beta$, enlarging in the direction of gas flow, wherein $\beta$ is approximated by the formula $$\beta = \arcsin \frac{(P_{in}/P_{out} - 1) \times a}{2L}$$

wherein
 $P_{in}$ is the pressure at the end of the substrate at the gas inlet side for $\beta = 0$,
 $P_{out}$ is the pressure at the end of the substrate at the gas outlet side for $\beta = 0$,
 L is the length of the substrate, and
 a is the smallest distance of the substrate from the opposite plate.

The dependence of the coating rate on the distance between opposite substrate surfaces can be advantageously used to produce optical components in which the coating layer or layers are wedge-shaped, e.g., wedge filters or graded interference filters. For example, to produce a graded interference filter, the angle of inclination between the surfaces of the substrates being coated is approximated, independent of the direction of gas flow, by the formula:

$$\alpha = \arcsin \frac{(\lambda_2/\lambda_1 - 1) \times a}{2L}$$

wherein
 $\lambda_2$ is the largest wavelength of the graded filter,
 $\lambda_1$ is the smallest wavelength of the graded filter,
 L is the length of the graded filter, and
 a is the smallest distance of the substrate from the opposite plate.

In this formula, it is assumed that the pressure drop between the substrate edge at the gas inlet side and the edge at the gas outlet side is equal to zero.

In simultaneously coating a plurality of substrates, different coating thicknesses can be applied on the substrates by spacing adjacent substrate pairs different distances apart. According to a preferred embodiment, the mixture of reaction gases is introduced through at least one gas inlet and withdrawn through at least one gas outlet in the reaction zone or chamber. The total gas flow of the mixture of reaction gases can be split into a plurality of component streams which are introduced through gas inlet lines into each reaction zone or chamber.

In a further preferred embodiment of the invention, a plurality of gas inlet lines are arranged with a plurality of plasma electrodes above the surface of a substrate to be coated. In this embodiment, the gas flow and the plasma propagation are in the same direction, i.e., perpendicular to the surface of the substrate to be coated. Since a fresh mixture of reaction gases is continuously supplied above the entire substrate surface, there is never a depletion of reaction gases over an area being coated. Thus, this process overcomes the problem of reaction gas depletion which occurs at the gas outlet side during the coating process when the gas flow is parallel to the surface being coated. By independently controlling the gas mass flow through each gas inlet line, the properties of the coating can be varied over the surface of the substrate.

The process of the present invention can also be used in coating substrates which are arranged vertically instead of horizontally.

BRIEF DESCRIPTION OF THE DRAWINGS

Various other features and attendant advantages of the present invention will be more fully appreciated as the same becomes better understood when considered in conjunction with the accompanying drawings, in which like reference characters designate the same or similar parts throughout the several views and wherein.

DETAILED DESCRIPTION

Figure 1:
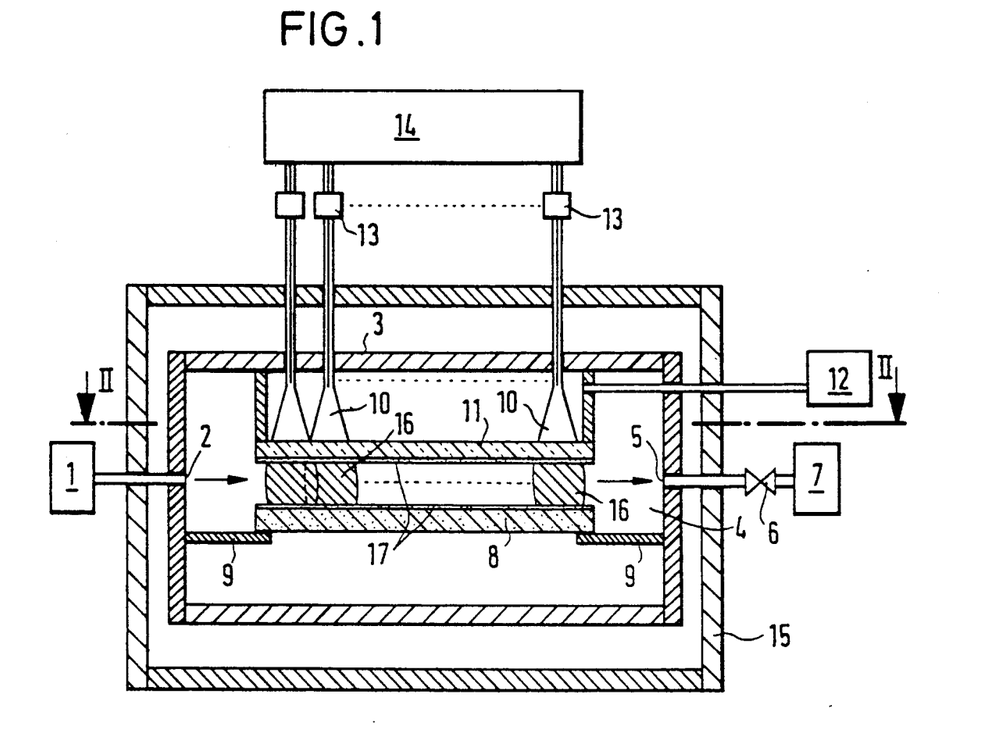
FIG. 1 is a schematic representation in the form of a vertical section of a device for carrying out the process of the present invention, in which a plasma pulse/CVD process is employed, illustrating the arrangement of a plurality of plasma electrodes in a plane above a substrate and the direction of plasma propagation perpendicular to the surface being coated.

According to FIG. 1, a gas source is connected via a gas inlet line in a wall of housing 3 to a reaction zone or space 4 in housing 3. At the opposite wall of housing 3 is gas outlet 5 having a throttle valve 6 therein. Gas in reaction zone 4 can be removed by a vacuum pump 7 via line 5 in valve 6. When a plasma pulse is used, it is preferred that the vacuum pump 7 and throttle valve 6 are regulated to reduce the pressure from about 0.1–20 mbar, and more preferably from about 0.5–10 mbar, with a predetermined mass flow of the mixture of reaction gases into reaction zone 4. Substrate 8 can be supported in reaction zone 4 by a substrate holder 9. A plurality of plasma electrodes 10 (shown here in the shape of horn antenna of platinum or of another thermostable metal) is arranged in a plane above substrate 8 in reaction zone 4. The arrangement of the plasma electrodes 10 is separated from reaction space 4 by a housing having a dielectric plate 11. The space inside the housing is evacuated by vacuum pump 12 to avoid flashovers between the electrodes. Plasma electrodes 10 are connected to a microwave generator 14 via control assembly 13 through which they can be separately switched and controlled. In order to heat substrate 8, the entire device is surrounded by oven 15, with the objective of improving the quality of the coating.

In operation, the microwave fields extend through the dielectric plate 11 and form a plurality of plasma columns 6 which overlap one another in reaction zone 4 between the plate 11 and the substrate surfaces to be coated. With each plasma pulse, a layer of coating 17 is deposited on the substrates and dielectric plate 11, the properties of the coating being set at each site on the substrate by the separate control of the individual plasma electrodes 10, arranged above a particular site on the substrate. The size and geometry of the areas to be coated is determined by the number and arrangement of plasma electrodes.

Figure 2:
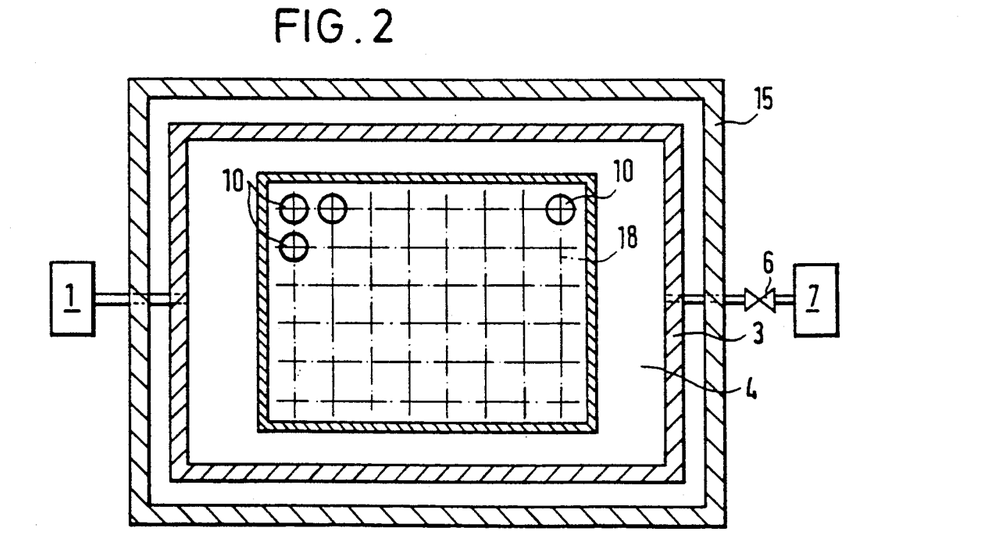
FIG. 2 is a plan view of the apparatus of FIG. 1 taken along line II—II of FIG. 1.

In FIG. 2, plasma electrodes 10 are shown arranged in a gridlike fashion above the substrate, as indicated by the phantom lines 18. Any other suitable arrangement can be used in which the plasma columns overlap one another so as to cover the entire area to be coated.

Figure 3:
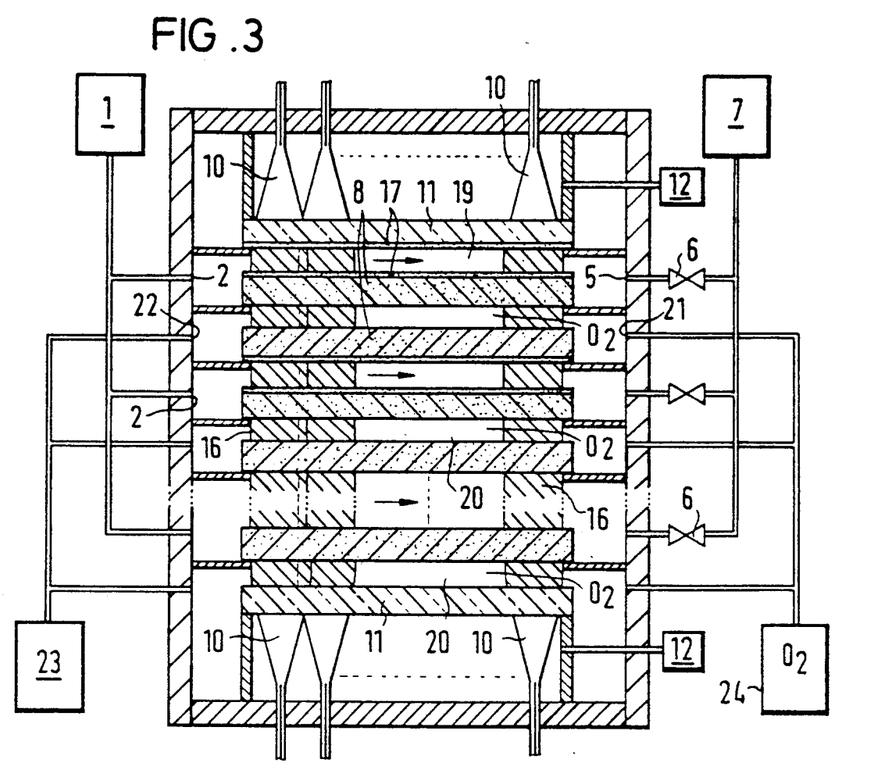
FIG. 3 is a schematic representation in vertical section of an apparatus for carrying out the process according to the invention, illustrating particularly the position of a plurality of substrates arranged one above the other which are heated by plasma heating, and further illustrating the gas flow during the coating and heating processes.

In the arrangement shown in FIG. 3, a plurality of substrates 8 are positioned one above the other. The surface of the two substrates to be coated face one another and define opposing walls of a reaction chamber 19 in reaction zone 4. The actual coating takes place in the reaction chamber 19. Each reaction chamber 19 contains a separate gas inlet 2 and gas outlet 5. The plasma electrodes 10, which are in a plane above and below the substrate arrangement, generate plasma columns 16 which pass through the substrates. The chambers 20 defined by the rear surfaces of substrates 8 are likewise equipped with gas inlets 21 and gas outlets 22. The chambers 20 can be evacuated by vacuum pump 23 via gas outlets 22. A non-reactive gas which emits UV radiation in a plasma, for example, oxygen in this embodiment, is introduced into chamber 20 via gas inlet 21. In operation, plasma column 16 extends through chambers 19 and 20. The UV radiation emitted by the excited oxygen is absorbed by and heats the substrates being coated. By non-reactive is meant that the gas does not react with the substrate material.

Figure 4:
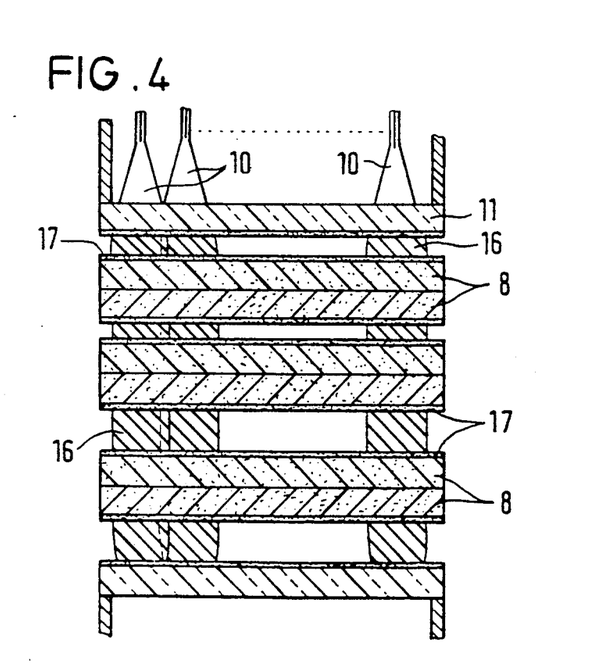
FIG. 4 is a representation in vertical section of another substrate arrangement according to the invention which is used for simultaneously coating a plurality of substrates.

In the arrangement shown in FIG. 4, substrates 8 contact one another with the rear surfaces. Compared with the arrangement in FIG. 3, this embodiment has the advantage that less space is occupied, and a plurality of substrates can simultaneously be coated. The spacing of the substrate pairs can vary in order to apply the coating at different rates. In this situation, the substrate can be heated in an oven before the coating takes place.

Figure 5:
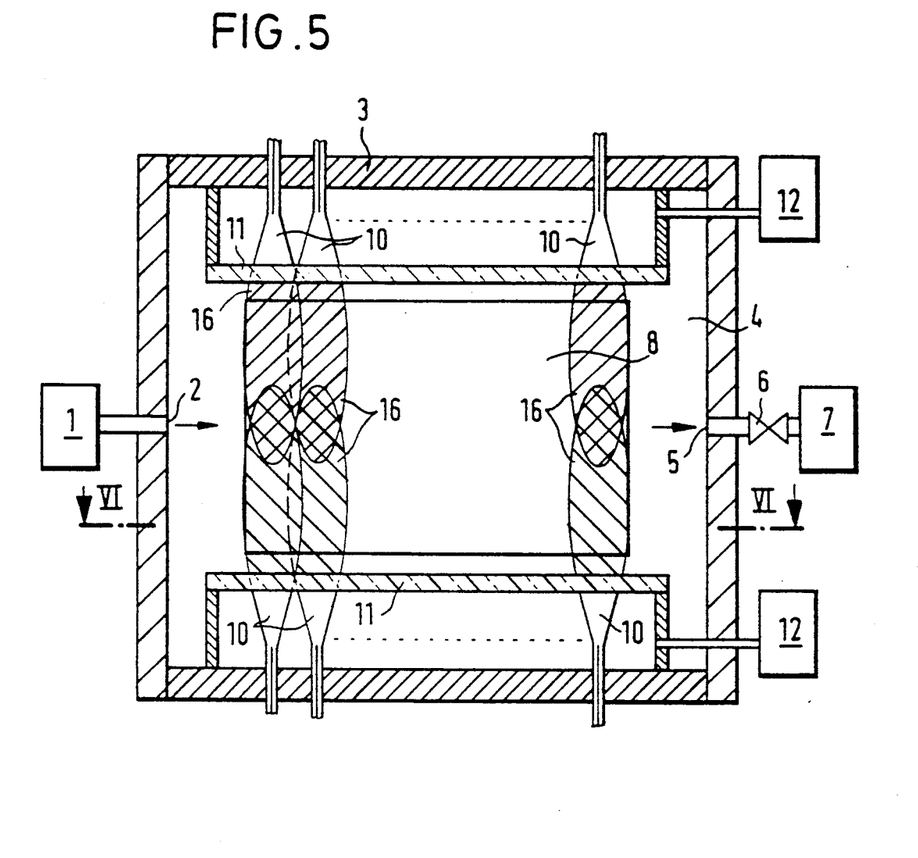
FIG. 5 is a representation in horizontal section of a preferred embodiment of the invention showing the arrangement of plasma electrodes in planes between the substrates and the position of the plasma column parallel to the substrates being coated.
Figure 6:
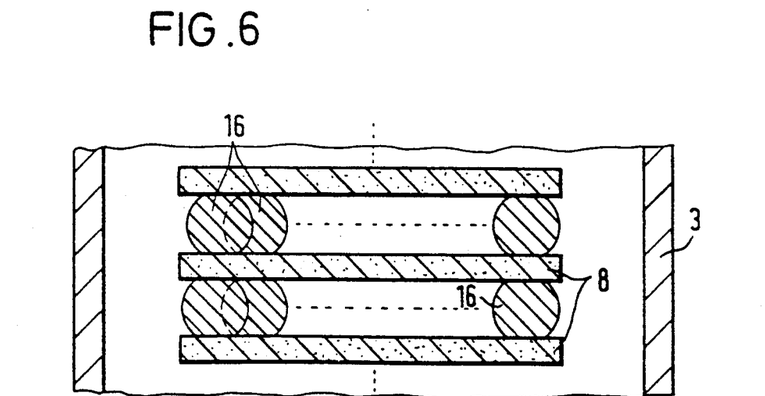
FIG. 6 is a plan view in partial section taken along line VI—VI of FIG. 5.

In another embodiment shown in FIG. 5, plasma electrodes 10 are positioned in a plane between the surfaces of two substrates 8 to be coated. With this arrangement, plasma columns 16 extend parallel to the plane of substrates 8. The position of the plasma zones relative to the substrates is illustrated in FIG. 6.

Figure 7:
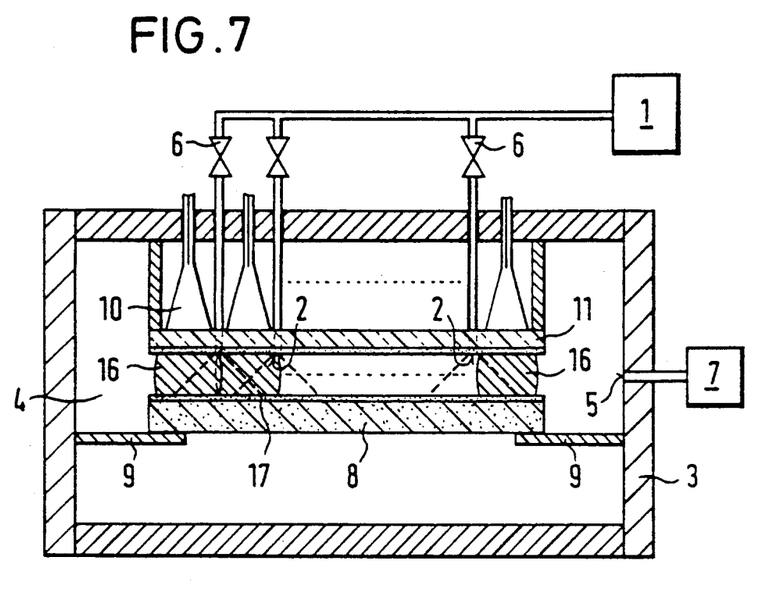
FIG. 7 shows a preferred embodiment of the invention, wherein a plurality of gas inlets supply a mixture of reaction gases to the reaction space and further illustrating the direction of plasma propagation and flow of the mixture of reaction gases in the same direction.

In a further embodiment of the invention illustrated in FIG. 7, the mixture of reaction gases enters the reaction chamber through a plurality of gas inlets 2. The inlets 2, together with plasma electrodes 10, are positioned above substrate 8. In this case, the direction of propagation of the plasma in reaction zone 4, as well as the gas mass flow, is perpendicular to the surface to be coated. The gas mass flow from each inlet line 2 can be separately adjusted by throttle valves 3.

Figure 8:
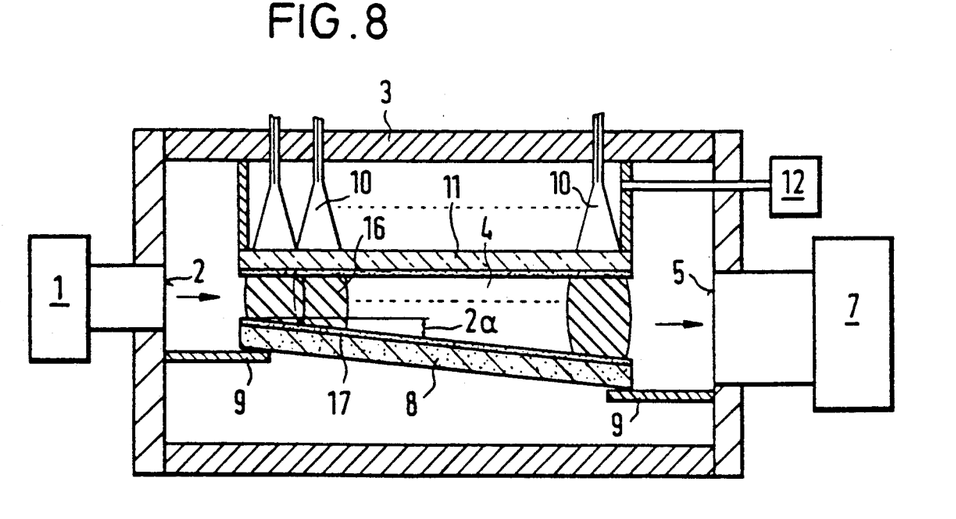
FIG. 8 shows a preferred embodiment of the invention, in which the substrate and a dielectric housing plate are inclined at an angle 2 with respect to one another.

FIG. 8 illustrates a preferred arrangement of compensating for the pressure drop in the flowing mixture of reaction gases between substrate 8 and a dielectric plate 11. The drop in pressure between substrate 8 and plate 11 often results in a non-uniform coating. In order to compensate for the pressure drop and produce a uniform coating, substrate 8 is positioned at an angle 2 to dielectric plate 11 (assuming that plate 11 is positioned horizontally).

Without further elaboration, it is believed that one skilled in the art can, using the preceding description, utilize the present invention to its fullest extent. The following preferred specific embodiments, therefore, are to be construed as merely illustrative and limitative of the remainder of the disclosure in any way whatsoever.

In the foregoing and in the following examples, all temperatures are set forth uncorrected in degrees Celsius; and, unless otherwise indicated, all parts and percentages are by weight.

The entire texts of all applications, patents, and publications, if any, cited above and below, and of corresponding West German Application No. P. 38 30 249.745, filed Sept. 6, 1988, are hereby incorporated by reference.

EXAMPLES

EXAMPLE 1

An illustrative embodiment (FIG. 1) for coating a large area planar substrate with a highly reflective coating in accordance with the process of the present invention is described herein. In this example, a plasma pulse process with a microwave plasma was used. The substrate consisted of quartz glass. The area to be coated was a circular area 45 cm in diameter. The distance to the dielectric plate, which was arranged opposite the substrate and was likewise coated, was 1.5 cm; the thickness of substrate and dielectric plate was 1 cm in each case. The electrodes for generating the microwave plasma were provided by horn antenna consisting of platinum with a horn diameter of 15 cm. Seven horn antenna were arranged above the area to be coated in such a way that the plasma columns generated by the individual antenna overlap one another in the regions being coated. Six of the horn antenna were grouped around a central horn antenna. All horn antenna were in mutual contact. The frequency of the microwave radiated was 2.45 GHz, the pulse duration 1 ms, and the pulse period 50 ms. The plasma electrodes, which were switched at the same time, were all operated at a mean power of 500 watts. The pressure in the space with plasma electrodes inside the housing with the dielectric plate was $10^{-4}$ mbar to avoid flashovers. The following mixture of reaction gases was used at the indicated mass flows shown in Table 1 below:

TABLE 1

| Compound | Mass Flow ml/min |
|---|---|
| $SiCl_4$ | 200 |
| $O_2$ | 800 |
| $CCl_2F_2$ | 4 |
| $GeCl_4$ | max. 24 |

To obtain a sinusoidal variation of the refractive index with the coating thickness, the mass flow of $GeCl_4$ was modulated sinusoidally at a period of 11 s. The number of layers with a periodically alternating refractive index was 500. Using this arrangement, the rate of coating was 0.72 m/min, and a coating approximately 6 angstroms thick was deposited per plasma pulse. During this process, the substrate temperature was 1000°, and the pressure was 3 mbar.

The resulting coated substrate was highly reflective at 520 nm and uniformly coated over a circular area 35 cm in diameter on both the substrate and the dielectric plate. Toward the edge, the thickness of the coating was slightly reduced. However, in accordance with the process of the present invention, this effect can be avoided by controlling the inner and outer plasma electrodes.

EXAMPLE 2

A circular substrate area 75 cm in diameter was coated in a manner similar to that described above in Example 1. In this example, 12 additional plasma electrodes were closely positioned around the plasma electrodes described above. The process parameters described above were used except for the gas mass flow rate, which was increased. The flow rate of the individual components in the mixture of reaction gases is listed in Table 2 below.

TABLE 2

| Compound | Flow Rate ml/min |
| --- | --- |
| $SiCl_4$ | 556 |
| $O_2$ | 2224 |
| $CCl_2F_2$ | 11 |
| $GeCl_4$ | max. 67 |

A coating having a uniform thickness was obtained over a circular area 65 cm in diameter.

The preceding examples can be repeated with similar success by substituting the generically or specifically described reactants and/or operating conditions of this invention for those used in the preceding examples. In general, this invention is particularly advantageous for coating substrates having a coating area of at least up to 150×150, especially 15×15 square centimeters. Apparatus for conducting the processes of this invention is also provided.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. In a plasma-CVD-process for simultaneously applying a dielectric coating to planar substrates, wherein an area or volume plasma zone covering the whole area to be coated of one or more substrates is generated from a plurality of plasma electrodes, the improvement comprising:

in a reaction zone containing one or more substrates to be coated, propagating overlapping plasma columns from the plasma electrodes substantially perpendicular to the surfaces to be coated and on either or both sides of the surfaces to be coated while maintaining the plasma electrodes and substrates stationary, and individually controlling the strength and duration of each plasma column, thereby controlling the properties and uniformity of the coating deposited at each site on the substrates.

2. A process according to claim 1, wherein the power supply to each plasma electrode used in generating the plasma columns is controlled independently of one another.

3. A process according to claim 1, wherein the mixture of reaction gases is subjected to an overlapping microwave plasma from microwave antenna.

4. A process according to claim 3, wherein the microwave antenna are selected from the group of large area radiators, dielectric antenna, and combinations thereof.

5. A process according to claim 3, wherein the microwave plasma is emitted from microwave rod radiators and/or horn antennae.

6. A process according to claim 1, wherein a plurality of substrates being coated are arranged one above the other with respect to the surfaces being coated and the plasma columns are generated from the plasma electrodes arranged above and/or below the substrate arrangement.

7. A process according to claim 6, wherein front surfaces of two adjacent substrates to be coated are spaced apart and face one another and define opposing walls of a reaction chamber into which the mixture of reaction gases is introduced, and introducing a second gas into contact with the rear surface of the substrates being coated, said second gas, when actuated by said plasma, emits UV radiation which heats the substrates to a desired temperature.

8. A process according to claim 7, wherein the second gas is oxygen.

9. A process according to claim 6, wherein the rear surfaces of a first pair of substrates to be coated are positioned in contact with one another, and similarly arranged additional substrate pairs are placed above and/or below the first substrate pair with front surfaces of the substrate pairs facing one another and spaced apart to form reaction chambers into which the mixture of reaction gases is introduced.

10. A process according to claim 7, wherein additional plasma electrodes are positioned to generate plasma columns in the space between the separated front surfaces of the substrates, with the plasma propagation being parallel to the surfaces being coated.

11. A process according to claim 1, wherein plasma columns are propagated between and substantially parallel to two spaced substrates or between a spaced substrate and dielectric plate, which are positioned one above the other with the surfaces to be coated being opposed and parallel or slightly inclined with respect to one another.

12. A process according to claim 11, wherein rear surfaces of adjacent substrate pairs are in contact, and similar additional substrate pairs are arranged spaced apart one above the other, with their opposing surfaces to be coated forming walls of a reaction chamber into which the mixture of reaction gases is introduced.

13. A process according to claim 11, wherein a front surface of the substrate is coated and wherein a rear surface of the substrate is in contact with a second gas which, when activated by a plasma, emits UV radiation to heat the substrate to a desired temperature.

14. A process according to claim 13, wherein the second gas is oxygen.

15. A process according to claim 1, wherein the plasma columns are generated by plasma electrodes separated from the reaction zone by a housing with a dielectric plate.

16. A process according to claim 15, wherein the housing is evacuated to a pressure sufficiently low to prevent flashovers in the reaction zone.

17. A process according to claim 15, wherein the housing contains $SF_6$.

18. A process according to claim 15, wherein the dielectric plate in the housing is a substrate which is coated during the process.

19. A process according to claim 1, wherein the mixture of reaction gases is introduced into the reaction zone through at least one gas inlet, and depleted reaction gases are withdrawn through at least one gas outlet.

20. A process according to claim 19, wherein a main source of the mixture of reaction gases is split into a plurality of component flows which lead to individual gas inlet openings.

21. A process according to claim 1, wherein the mixture of reaction gases flows along and in contact with the surfaces to be coated.

22. A process according to claim 1, wherein a plurality of gas inlet lines are arranged with a plurality of plasma electrodes above the surface of the substrate to be coated, and the plasma propagation and the flow of the mixture of reaction gases is perpendicular to the surface of the substrate being coated.

23. A process according to claim 22, wherein the gas mass flow through each gas inlet line is independently controlled.

24. A process according to claim 1, wherein the mixture of reaction gases is subjected to a plasma pulse for a period sufficient to react substantially all of the reaction gases.

25. A process according to claim 24, wherein a plurality of substrates arranged one above the other are simultaneously coated, and wherein the quantity of coating material deposited on the surface of each substrate during a plasma pulse is controlled by varying the distance between adjacent substrates or between a substrate and a dielectric plate.

26. A process according to claim 25, wherein after each plasma pulse the remnants of the mixture of reaction gases are removed from the reaction zone and replaced by a fresh mixture of reaction gases, and wherein during the plasma pulse the gas inlet and outlets are closed.

27. A process according to claim 24, wherein a mixture of reaction gases is continuously passed through the reaction zone, and the gas mass flow is adjusted so that in the interval between plasma pulses, the entire spent mixture of reaction gases is withdrawn from the reaction zone and replaced by a fresh mixture of reaction gases.

28. A process according to claim 27, wherein two opposed substrates or an opposed substrate and dielectric plate are inclined at an angle of less than 30° with respect to one another.

29. A process according to claim 28, wherein a graded filter is produced by positioning two opposed substrates or an opposed substrate and dielectric plate at an angle of $2\alpha$ with respect to one another, and wherein $\alpha$ is approximated by the formula:

$$\alpha = \arcsin \frac{(\lambda_2/\lambda_1 - 1) \times a}{2L}$$

wherein
$\lambda_2$ is the largest wavelength of the graded filter,
$\lambda_1$ is the smallest wavelength of the graded filter,
L is the length of the graded filter, and
a is the smallest distance between the substrate and the opposite substrate or dielectric plate.

30. A process according to claim 28, wherein a coating is produced having a uniform thickness by positioning two opposed substrates or an opposed substrate and dielectric plate at an angle of $2\beta$ with respect to one another, which angle enlarges in the direction of the gas flow, and wherein $\beta$ is approximated by the formula $$\beta = \arcsin \frac{(P_{in}/P_{out} - 1) \times a}{2L}$$

wherein
$P_{in}$ is the pressure at the end of the substrate at the gas inlet side for $\beta = 0$,
$P_{out}$ is the pressure at the end of the substrate at the gas outlet side for $\beta = 0$,
L is the length of the substrate, and
a is the smallest distance of the substrate from the opposite substrate or dielectric plate.

31. A process according to claim 1, wherein the coating process is carried out at a pressure in the reaction zone of between 0.1 and 20 mbar.

32. A process according to claim 1, wherein the distance between opposed substrate surfaces being coated or between the opposed surface of a substrate and a dielectric plate being coated is between 1 and 300 mm.

33. A process according to claim 1, wherein the substrates are heated during the coating process to a temperature of between 200 and 1200° C.

34. A process according to claim 1, wherein plasma columns at the edge of the substrate or dielectric plate being coated are of greater strength and/or of different duration than the plasma columns contacting the interior surfaces being coated, thereby producing a coating of uniform thickness.

* * * * *